United States Patent [19]
Park

[11] Patent Number: 5,920,208
[45] Date of Patent: Jul. 6, 1999

[54] POWER DOWN CIRCUIT AND METHOD OF SENSE AMPLIFIER

[75] Inventor: Yeon-Jun Park, Choongcheongbuk-Do, Rep. of Korea

[73] Assignee: LG Semicon Co., Ltd., Cheongju, Rep. of Korea

[21] Appl. No.: 08/949,396

[22] Filed: Oct. 14, 1997

[30] Foreign Application Priority Data

Oct. 15, 1996 [KR] Rep. of Korea ............... 96-45872

[51] Int. Cl.⁶ ............... G11C 7/06; H03K 3/02
[52] U.S. Cl. ............... 327/54; 327/52; 327/198; 365/226
[58] Field of Search ............... 327/51–57, 544, 327/67, 143, 198; 365/226, 227

[56] References Cited

U.S. PATENT DOCUMENTS

| | | | |
|---|---|---|---|
| 5,160,861 | 11/1992 | Lee | 327/51 |
| 5,306,970 | 4/1994 | Phillips | 327/57 |
| 5,781,041 | 7/1998 | Lee et al. | 327/51 |

*Primary Examiner*—Toan Tran
*Attorney, Agent, or Firm*—Fleshner & Kim

[57] ABSTRACT

A power down circuit and method of a sense amplifier for a semiconductor memory device prevents undesirable power consumption by detecting when sensing is completed in the sense amplifier and inhibiting a power supply current flow to the sense amplifier after the detection. The power down circuit includes a data comparator for comparing data outputs from a sense amplifier to inhibit the supply current of the sense amplifier by detecting the sensing operation completion in the sense amplifier, a data latch unit for latching the comparison result from the data comparator, a data enable/reset unit for outputting or resetting the latched comparison result, and a power down unit for turning on or off the sense amplifier circuit based on the comparison result outputted from the data enable/reset unit.

26 Claims, 4 Drawing Sheets

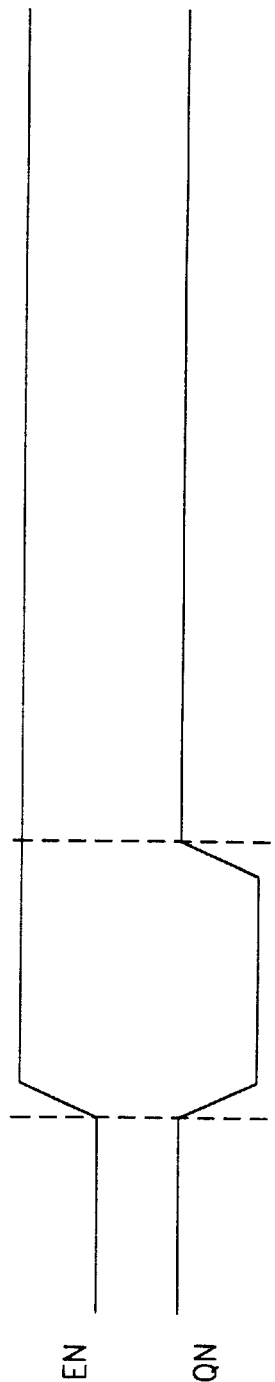
FIG. 4A SEN
FIG. 4B EQN
FIG. 4C D,DB
FIG. 4D SAOUT SAOUTB
FIG. 4E OUT40
FIG. 4F OUT50
FIG. 4G OUT60

POWER DOWN CIRCUIT AND METHOD OF SENSE AMPLIFIER

BACKGROUND OF THE INVENTION

1. Field of the Invention

The present invention relates to a sense amplifier of a semiconductor memory device, and more particularly, to a power down circuit of a sense amplifier that prevents undesirable power consumption.

2. Background of the Related Art

As shown in FIG. 1, a related art sense amplifier circuit in a semiconductor memory device includes an automatic power down unit 1 for outputting a sense amplifier enable signal (SEN) upon receiving an address transition detection signal (ATD) outputted from an address transition detector (not illustrated), a first sense amplifier 2 for performing a sensing operation upon receiving the sense amplifier enable signal (SEN) outputted from the automatic power down unit 1, and a second sense amplifier 3 for sensing more completely the data sensed in the first sense amplifier 2.

The first sense amplifier 2 includes PMOS transistors 20, 21 that receive a voltage source (Vcc) and having commonly coupled gates to form a current mirror. A PMOS transistor 22 has its source coupled to a node where the gate and the drain of the PMOS transistor 20 are commonly coupled, its drain coupled to the drain of the PMOS transistor 21 and its gate receiving an equalization (EQN) signal. An NMOS transistor 23 has its drain coupled to the source of the PMOS transistor 22 and its gate receives a data bar signal (DB). An NMOS transistor 24 has its drain coupled to the drain of the PMOS transistor 22, the gate receives a data (D) and the source coupled to the source of the NMOS transistor 23. Further, PMOS transistors 25, 26, 27 and NMOS transistors 28, 29 are coupled using the same structure as the PMOS transistors 20, 21, 22 and the NMOS transistors 23, 24. An NMOS transistor 30 has its drain coupled to the commonly coupled sources of the NMOS transistors 23, 24, 28, 29, its source coupled to ground and its gate receiving the sense amplifier enable signal (SEN).

The second sense amplifier 3 includes PMOS transistors 31, 32, 33 and NMOS transistors 34, 35 coupled using the same structure as the PMOS transistors 20, 21, 22 and the NMOS transistors 23, 24. The second sense amplifier also includes an NMOS transistor 36 having its drain coupled to the commonly coupled sources of the NMOS transistors 34, 35 its gate receives the sense amplifier enable signal (SEN) and the source is grounded.

The operation of the related art sense amplifier of the semiconductor memory device will now be described with reference to FIGS. 1 and 2.

First, the address transition detection signal (ATD) shown in FIG. 2A outputted from the address transition detector (not illustrated) in accordance with the transition of an address signal (not illustrated) is inputted to the automatic power down unit 1. Then, the automatic power down unit 1 generates an auto power down signal (APD) as shown in FIG. 2B and outputs the sense amplifier enable signal (SEN) extended by a predetermined width as shown in FIG. 2C.

Then, as shown in FIG. 2D, when the equalization signal (EQN) is enabled to be low, the PMOS transistors 22, 27, 33 are turned on, whereby an electric potential of each pair of nodes (N1 and N2, N3 and N4, N5 and N6) comes to have an identical value. Then, when the equalization signal (EQN) is disabled to be high, the PMOS transistors 22, 27, 33 are turned off to complete the equalization operation.

As described above, at the point when the equalization operation is completed, that is, when the equalization signal (EQN) is made high and the sense amplifier enable signal (SEN) is high, the sense amplifiers 2, 3 start sensing.

First, sense amplifier enable transistors 30, 36 (i.e., the NMOS transistors 30, 36) are turned on in accordance with the high sense amplifier enable signal (SEN) and then the PMOS transistors 22, 27, 33 are turned off in accordance with the high equalization signal (EQN). Next, when the data signal (D) and the data bar signal (DB) are as shown in FIG. 2E, the NMOS transistor 24 is turned on more fully than the NMOS transistor 23. As a result, more current flows through the NMOS transistor 24 than the NMOS transistor 23 and the electrical potential of the node (N2) is lowered relative to the node (N1).

In the same way, the data (D) signal is inputted to the gate of the NMOS transistor 28, and the data bar (DB) signal is inputted to the gate of the NMOS transistor 29. As a result, since more current flows through the NMOS transistor 28 than through the NMOS transistor 29, the electrical potential of the node (N3) is lowered relative to that of the node (N4).

The gate of the NMOS transistor 35 of the second sense amplifier 3 receives the low level of the node (N2) and the gate of the NMOS transistor 34 is applied with the high level of the node (N4). Therefore, the electrical potential of the node (N5) is lowered relative to that of the node (N6).

Accordingly, as shown in FIG. 2F, the data signal and the data bar signal that are difficult to be respectively recognized completely as high and low can be outputted as signals recognizable as high (SAOUT) and low (SAOUTB).

However, in the related art sense amplifier of the semiconductor memory device, the sense amplifier continues to operate while a sense amplifier enable pulse signal (SEN) outputted from the automatic power down unit 1 is high level, and an unnecessary sensing current continues flowing even when the sensing is quickly completed, which results in increasing power consumption.

SUMMARY OF THE INVENTION

It is an object of the present invention to solve at least the above-described problems of the related art.

It is another object of the present invention to provide a power down circuit of a sense amplifier for a semiconductor memory device that prevents undesirable power consumption.

It is yet another object of the present invention to provide a power down circuit for a sense amplifier for a semiconductor devices that detects the point when the sensing is completed in the sense amplifier and inhibits a current flow in accordance with the detection.

To achieve at least the above objects in whole or in part, a power down circuit of a sense amplifier for a semiconductor memory device includes a data comparator for comparing data outputs from a sense amplifier to automatically inhibit power current supply to the sense amplifier by detecting a sensing operation completion point in the sense amplifier circuit, a data latch unit for latching a comparison signal output from the data comparator, a data enable/reset unit for outputting or resetting the latched comparison output signal, and a power down unit for turning on and off current supply to the sense amplifier circuit based on a signal outputted from the data enable/reset unit.

To achieve at least the above objects in whole or in part, a sense amplifier for a semiconductor memory device, includes a data comparator that compares data outputs from a sense amplifier circuit; and a power down unit that turns off current supply to the sense amplifier circuit based on a comparison signal from the data comparator.

To achieve at least the above objects in whole or in part, a method of operating a power down circuit for use with a sense amplifier for a semiconductor memory device, includes comparing data outputs from a sense amplifier, latching a comparison signal output from the comparing step, outputting the latched comparison signal and turning off current supply to the sense amplifier based on the latched comparison signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 4A is a waveform diagram showing a sense amplifier enable signal in the circuit of FIG. 3;

FIG. 4B is a waveform diagram showing an equalization signal in the circuit of FIG. 3;

FIG. 4C is a waveform diagram showing data and data bar signals in the circuit of FIG. 3;

FIG. 4D is a waveform diagram showing a sense amplifier output and output bar signals in the circuit of FIG. 3;

FIG. 4E is a waveform diagram showing an output signal from a data comparator in the circuit of FIG. 3;

FIG. 4F is a waveform diagram showing an output signal from a data latch unit in the circuit of FIG. 3; and FIG. 4G is a waveform diagram showing an output signal from a data enable/reset unit in the circuit of FIG. 3.

DETAILED DESCRIPTION OF PREFERRED EMBODIMENTS

A first preferred embodiment of a power down circuit of a sense amplifier for a semiconductor memory device according to the present invention will now be described with reference to FIGS. 3 and 4.

Figure 3:
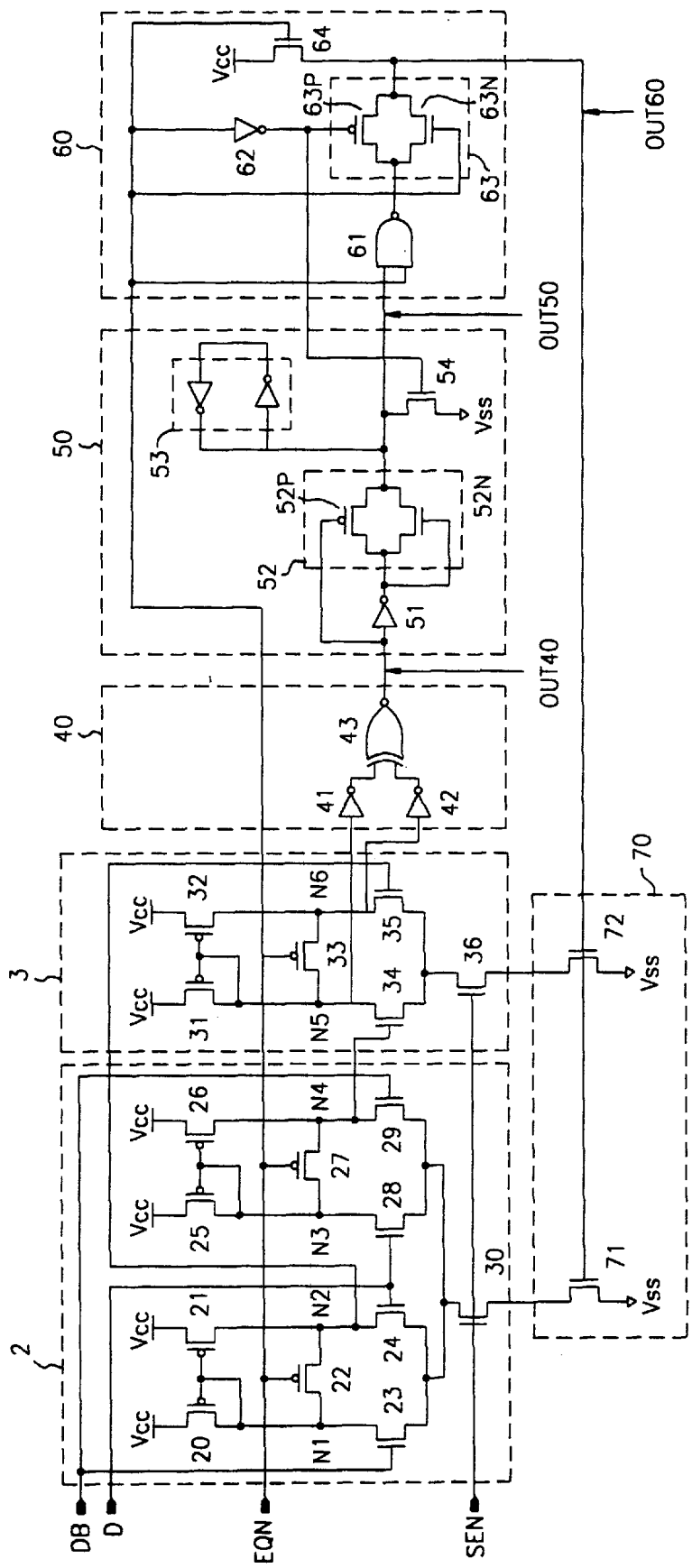
FIG. 3 is a circuit diagram showing a preferred embodiment of a power down unit of a sense amplifier for use in a semiconductor memory device according to the present invention.

As shown in FIG. 3, the first preferred embodiment of the power down circuit includes first and second sense amplifiers 2, 3, a data comparator 40 for comparing outputs from the sense amplifiers 2, 3, a data latch unit 50 for latching a signal output from the data comparator 40, a data enable/reset unit 60 for enabling the latched data and thereby outputting or resetting the data, and a power down unit 70 for turning on or off the first and second sense amplifiers 2, 3 in accordance with the data value outputted from the data enable/reset unit 60.

The first and second sense amplifiers 2, 3 have similar structure to the related art and are designated with the same reference numerals. Accordingly, the detailed description will omitted.

Figure 1:
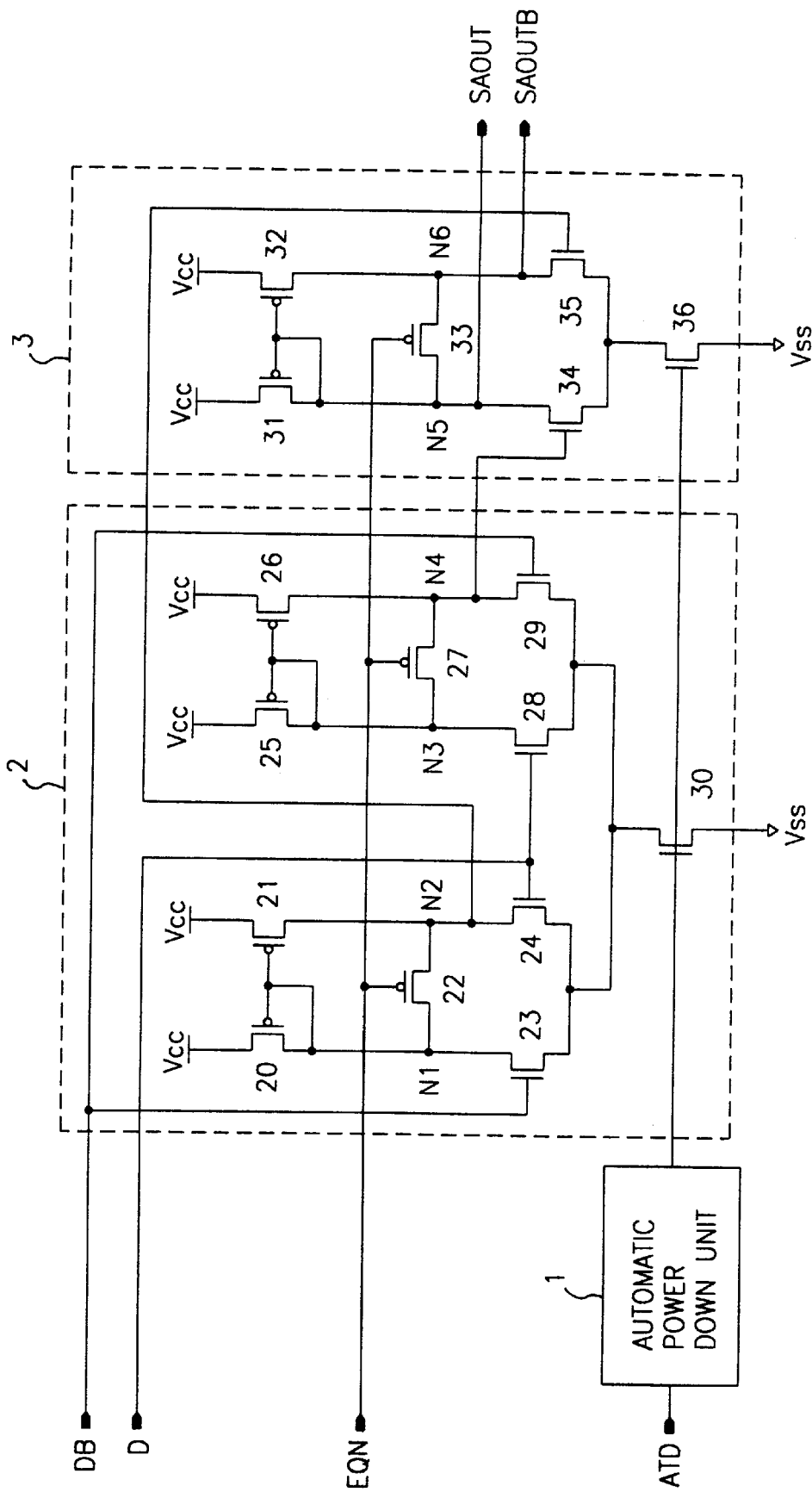
FIG. 1 is a schematic circuit diagram showing a related art sense amplifier of a semiconductor memory device.
Figure 2:
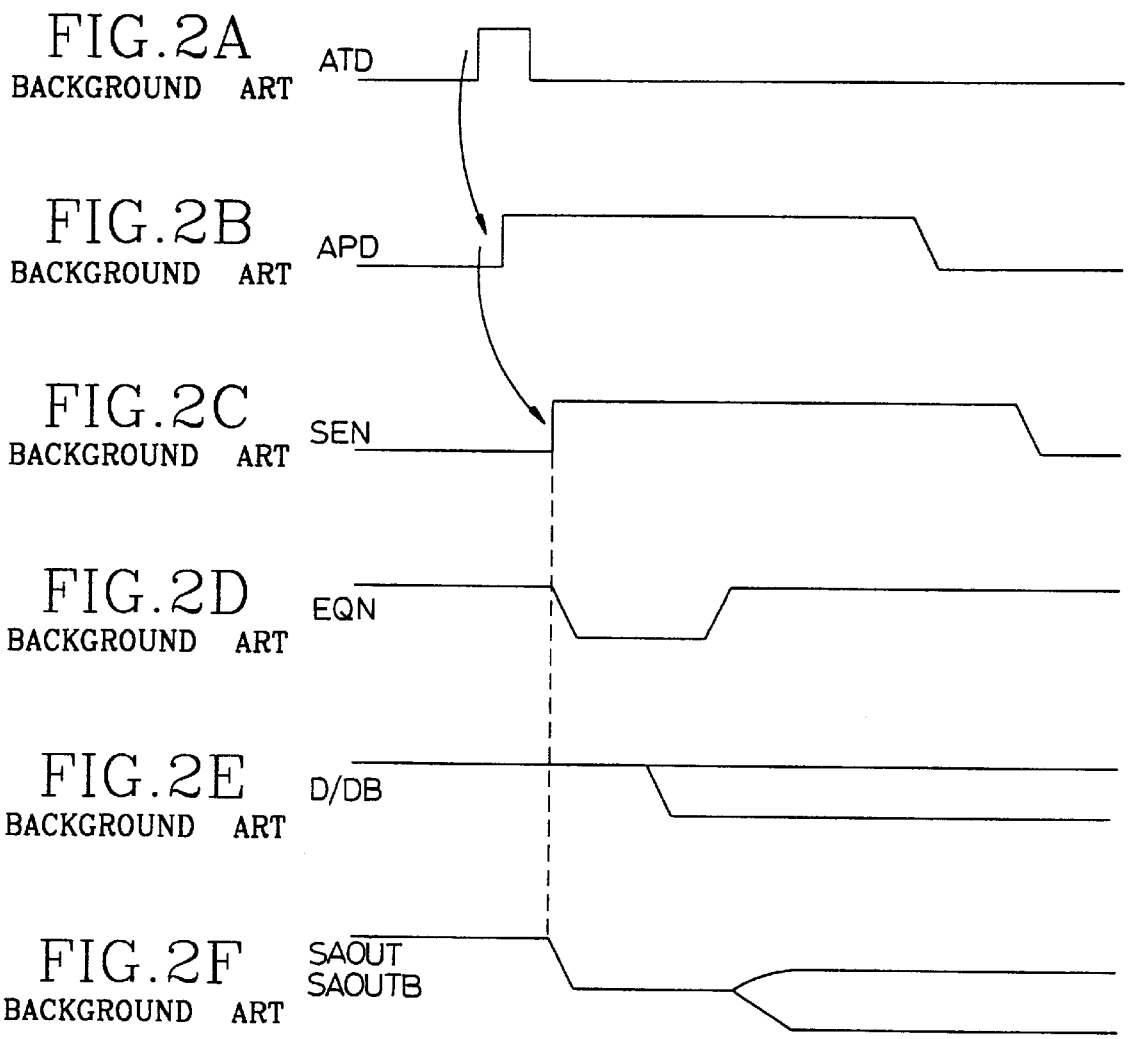
FIG. 2A is a waveform diagram showing an address transition detection signal in the circuit of FIG. 1.
FIG. 2B is a waveform diagram showing an automatic power down signal in the circuit of FIG. 1.
FIG. 2C is a waveform diagram showing a sense amplifier enable signal in the circuit of FIG. 1.
FIG. 2D is a waveform diagram showing an equalization signal in the circuit of FIG. 1.
FIG. 2E is a waveform diagram showing data and data bar signals in the circuit of FIG. 1.
FIG. 2F is a waveform diagram showing a sense amplifier output signal and a sense amplifier output bar signal in the circuit of FIG. 1.

However, the sources of NMOS transistors 30, 36 are not directly coupled to ground as in the related art circuit of FIG. 1, but are instead coupled to a power down unit 70 in the power down circuit.

The sense amplifiers 2, 3 of FIG. 3 complete the sensing by operations similar to the related art and output sense amplifier output signals (SAOUT, SAOUTB).

The data comparator 40 includes a first inverter 41 for inverting the sense amplifier output signal (SAOUT) and a second inverter 42 for inverting the sense amplifier output bar signal (SAOUTB). The data comparator further includes an exclusive OR gate 43 for XORing output signals from the first and second inverters 41, 42.

The data latch unit 50 includes an inverter 51 for inverting an output signal (OUT40) from the exclusive OR gate 43, a transmission gate 52 for transmitting an output signal from the inverter 51, a reverse parallel inverter latch 53 for latching an output signal (OUT50) transmitted from the transmission gate 52, and an NMOS transistor 54 whose drain receives the output signal (OUT50) from the transmission gate 52 and having a source coupled to ground.

The output signal (OUT40) from the exclusive OR gate 43 of the data comparator 40 is applied to the gate of a PMOS pass transistor 52P of the transmission gate 52 and the output signal from the inverter 51 is applied to the gate of an NMOS pass transistor 52N of the transmission gate 52.

The data enable/reset unit 60 includes a NAND gate 61, a transmission gate 63 and a PMOS transistor 64. The NAND gate 61 NANDs the output signal (OUT50) from the transmission gate 52 latched by the data latch unit 50 and the equalization signal(EQN). The transmission gate 63 transmits an output signal from the NAND gate 61. The PMOS transistor 64 whose drain receives an output (OUT60) from the transmission gate 63, has its source receiving a source voltage (Vcc) and the gate receiving the equalization signal (EQN).

The gate of a pass PMOS transistor 63P of the transmission gate 63 is applied with the equalization signal EQN) through an inverter 62, and the gate of an NMOS pass transistor 63N of the transmission gate 63 is applied with the equalization signal (EQN). The equalization signal (EQN) inverted through the inverter 62 of the data enable/reset unit 60 is also applied to the gate of the NMOS transistor 54 of the data latch unit 50.

The power down unit 70 includes NMOS transistors 71, 72 whose respective sources are coupled to ground. The respective gates of the NMOS transistors 71, 72 are each applied with the output signal (OUT60) transmitted from the transmission gate 63. Further, the drain of the NMOS transistor 71 is coupled to the source of the NMOS transistor 30 of the first sense amplifier 2 and the drain of the NMOS transistor 72 is coupled to the source of the NMOS transistor 36 of the second sense amplifier 3.

Operations of the first preferred embodiment of the power down circuit will now be described with reference to FIGS. 4A through 4G.

First, in a data hold region (1R), the PMOS transistors 22, 27, 33 the NMOS transistors 30, 36 are turned off in accordance with a low level of the sense amplifier enable signal (SEN) as shown in FIG. 4A and a high level of equalization signal (EQN) as shown in FIG. 4B. As a result, because an equalization is not performed, the sense amplifier is turned off. Consequently the sensing of the data lines is not performed, whether the NMOS transistors 71, 72 are turned on or off.

In a data equalized region (R2), the data signal (D) and the data bar signal (DB) shown in FIG. 4C are inputted when the sense amplifier enable signal (SEN) shown in FIG. 4A is shifted to a high level and the equalization signal (EQN) shown in FIG. 4B is enabled to be low level.

Next, similar to the related art, in the sense amplifiers 2, 3, the PMOS transistors 22, 27, 33 are turned on based on the low level of the equalization signal (EQN) and the NMOS transistors 30, 36 are turned on based on the high level of the sense amplifier enable signal (SEN). However, the NMOS transistors 71, 72 are enabled based on the output signal (OUT60), which is made high level by the PMOS transistor 64.

Accordingly, since identical amounts of current flow to each node in the respective node pairs, (N1 and N2, N3 and N4, N5 and N6), an equalization operation is performed to establish the same electrical potential on each node.

When the equalization of each node is completed, the PMOS transistors 22, 27, 33 are turned off based on a high level of the equalization signal (EQN) in a sensing region (R3) as shown in FIG. 4B. Here, when the data and data bar signals shown in FIG. 4C are inputted, the sense amplifiers 2, 3 are operated in a similar manner as in the related art sense amplifiers in FIG. 1 and thereby generate sense amplifier output and output bar signals (SAOUT, SAOUTB) as shown in FIG. 4D.

Then, the completion of the sensing operation in the sense amplifier is detected in the data comparator 40, the data latch unit 50 and the data enable/reset unit 60 as described below, and as a result, the sensing current is inhibited.

First, when the sensing is completed, the high level sense amplifier output (SAOUT) and the low level sense amplifier output bar signal (SAOUTB) are inverted through the inverters 41, 42 and XORed according to the exclusive OR gate 43 to output a low level output signal (OUT 40) as shown in FIG. 4E. If the output signals (SAOUT, SAOUTB) from the sense amplifier are at the same level, such as after the equalization operation, the exclusive OR gate outputs a high level signal.

The low level output signal (OUT40) is made high level through the inverter 51 and inputted to the transmission gate 52. The high level signal that has passed through the inverter 51 is applied to the gate of NMOS transistor 52N of the transmission gate 52, and the low level output signal (OUT40) is applied to the gate of the PMOS transistor 52P of the transmission gate 52. As a result, the transmission gate 52 is turned on and the high level signal is transmitted through the transmission gate 52 as the output signal (OUT50) shown in FIG. 4F.

Here, the output signal (OUT50) is latched in the latch unit 50 and is inputted to the NAND gate 61 of the data enable/reset unit 60. The NAND gate 61 NANDs the high level output signal (OUT50) from the data latch unit 50 and the high level equalization signal (EQN) and outputs a low level resultant signal.

As the low level output signal from the NAND gate 61 is inputted to the transmission gate 63, the high level equalization signal (EQN) is inverted through the inverter 62 and applied as a low level signal to the gate of the PMOS transistor 63P of the transmission gate 63. The high level equalization signal (EQN) is also applied to the gate of the NMOS transistor 63N, and as a result, a low level output signal (OUT60) shown in FIG. 4G is transmitted through the transmission gate 63.

Further, the PMOS transistor 64 is turned off based on the high level equalization signal (EQN) and the NMOS transistors 71, 72 are turned off based on the low level output signal (OUT60). As a result, the sense amplifiers 2, 3 cease the sensing operation.

As described above, according to the first preferred embodiment of the present invention, the first and second sense amplifiers 2, 3 are connected to the data comparator 40, the data latch unit 50, and the data enable/reset unit 60 and the power down unit 70. After the sensing is completed in the sense amplifiers 2, 3, that is, when data signal in the semiconductor memory cell can be recognized sufficiently as high level and the data bar signal sufficiently as low level, the sense amplifier circuit itself detects the completion of the sensing to turn off the sense amplifiers. Thus, a sense amplifier circuit for reducing unnecessary power consumption is provided to make a semiconductor memory circuit requiring less power.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A power down circuit for use with a sense amplifier for a semiconductor memory device comprising:

a data comparator that includes a logic circuit that logically compares data outputs from a sense amplifier;

a data latch unit coupled to the data comparator that includes a first transmission gate and latches a comparison signal output from the data comparator;

a data enable/reset unit coupled to the data latch unit that includes a second transmission gate, wherein the data enable/reset unit receives the latched comparison output signal; and a power down unit coupled between the sense amplifier and the data enable/reset unit that turns off current supply to the sense amplifier according to an output signal from the data enable/reset unit.

2. The circuit of claim 1, wherein the data comparator inhibits power current supply to the sense amplifier upon detecting completion of a sensing operation in the sense amplifier.

3. The circuit of claim 2, wherein the data comparator detects completion of the sensing operation based on the data outputs.

4. The circuit of claim 1, wherein the data enable/reset unit receives an equalization signal and resets at least one of the latched comparison output signal and the power down unit.

5. The circuit of claim 1, wherein the power down unit turns on current supply to the sense amplifier according to the output signal from the data enable/reset unit.

6. The circuit of claim 1, wherein the data comparator comprises:

first and second logic gates that each inverting a data output signal outputted from the sense amplifier; and a third logic gate that logically processes an output signal from each of the first and second logic gates.

7. The circuit of claim 6, wherein the first and second logic gates are inverters and the third logic gate is an exclusive OR gate.

8. The circuit of claim 1, wherein the data latch unit comprises:

an inverter that receives the comparison signal output from the data comparator;

the first transmission gate that transmits an output signal from the inverter;

a latch that latches an output signal from the transmission gate; and a transistor that transitions an output level of the transmission gate output signal low based on an equalization signal.

9. The circuit of claim 1, wherein the data enable/reset unit comprises:

a first logic gate that logically processes an output signal from the data latch unit and an equalization signal;

the second transmission gate that transmits an output signal from the first logic gate; and a transistor having a source receiving a supply voltage, a gate receiving the equalization signal and a drain coupled to an output of the transmission gate and to the power down unit.

10. The circuit of claim 1, wherein the power down unit comprises a plurality of transistors each having control electrodes receiving an output signal from the data enable/reset unit, and first and second electrodes coupled in series between a power supply voltage and a power supply connection of the sense amplifier.

11. The circuit of claim 10, wherein the transistors are NMOS transistors and the first, second and third electrodes are a source, a drain and a gate, respectively.

12. A semiconductor device, comprising:

first and second sense amplifiers that sense first and second signals, respectively;

a third amplifier that senses an output of the first and second sense amplifiers to output a pair of third signals;

a first transistor that controls the first and second amplifiers;

a second transistor that controls the third amplifier said first and second transistors being responsive to a control signal;

a feed back unit that compares the pair of third signals of the third sense amplifier and generates an enable/disable signal; and a power down unit responsive to the enable/disable signal that turns off the first, second and third sense amplifiers, wherein the power down unit includes third and fourth transistors, and wherein the third and fourth transistors are respectively connected to the first and second transistors.

13. The semiconductor device of claim 12, wherein the feed back unit receives an equalization signal to reset the power down unit, and wherein the feedback unit comprises:

a data comparator that compares the pair of third signals received from the third sense amplifier;

a data latch unit that latches a comparison signal output by the data comparator; and a data enable/reset unit that receives a fourth signal from the data latch unit and the equalization signal and outputs the enable/disable signal.

14. The semiconductor device of claim 13, wherein the data enable/reset unit resets the fourth signal and resets the power down unit using the enable/disable signal.

15. The semiconductor device of claim 13, wherein the third and fourth transistors each has control electrodes receiving the enable/disable signal from the data enable/reset unit, and first and second electrodes coupled in series between a power supply voltage and the first and second transistors.

16. The semiconductor device of claim 15, wherein the transistors are NMOS transistors and the first, second and control electrodes are a source, a drain and a gate, respectively.

17. A method of operating a semiconductor memory device, comprising the steps of:

sensing first and second input signals of first and second amplifiers, respectively;

sensing data outputs from the first and second sense amplifiers with a sense amplifier to output a pair of output signals;

controlling the first and second amplifiers with a first transistor;

controlling the third amplifier with a second transistor, the first and second transistors being responsive to a control signal;

comparing the pair of output signals from the third sense amplifier and generating a enable/disable signal with a feed back unit;

turning off current supply to the first, second and third sense amplifiers responsive to the enable/disable signal using a power down unit, wherein the power down unit includes third and fourth transistors, and wherein the third and fourth transistors are respectively connected to the first and second transistors.

18. The method of claim 17, wherein the comparing step detects completion of a sensing operation in the sense amplifiers based on the pair of output signals.

19. The method of claim 17, further comprising:

resetting the enable/disable signal; and turning on the current supply to the sense amplifiers based on the enable/disable signal.

20. The method of claim 17, wherein the comparing step uses the feed back unit that comprises:

a first logic gate that logically processes a comparison signal based on the pair of output signals and an equalization signal;

a transmission gate that transmits an output signal from the first logic gate; and a fifth transistor having a source receiving a supply voltage, a gate receiving the equalization signal and a drain coupled to an output of the transmission gate and to the power down unit.

21. The method of claim 17, wherein the turning off step uses the third and fourth transistors each having control electrodes receiving the enable/disable signal, and first and second electrodes coupled in series between a power supply voltage and the first and second transistors, wherein the transistors are NMOS transistors and the first, second and control electrodes are a source, a drain and a gate, respectively.

22. The semiconductor device of claim 13, wherein the data comparator comprises:

first and second logic gates that each inverting one of the pair of third signals outputted by the third sense amplifier; and a third logic gate that logically processes an output signal from each of the first and second logic gates.

23. The semiconductor device of claim 13, wherein the data latch unit comprises:

a first logic gate that receives the comparison signal output from the data comparator;

a transmission gate that transmits an output signal from the first logic gate;

a latch that latches an output signal from the transmission gate; and a fifth transistor that transitions an output level of the transmission gate output signal low based on the equalization signal.

24. The semiconductor device of claim 13, wherein the data enable/reset unit comprises:

a first logic gate that logically processes an output signal from the data latch unit and the equalization signal;

a transmission gate that transmits an output signal from the first logic gate; and a fifth transistor having a source receiving a supply voltage, a gate receiving the equalization signal and a drain coupled to an output of the transmission gate and to the power down unit.

25. A power down circuit for use with a sense amplifier for a semiconductor memory device, comprising:

a data comparator that compares data outputs from a sense amplifier;

a data latch unit that latches a comparison signal output from the data comparator, wherein the data latch unit comprises, an inverter that receives the comparison signal output from the data comparator, a transmission gate that transmits an output signal of the inverter, a latch that latches an output signal from the transmission gate, and a transistor that transitions an output level of the transmission gate output signal low based on an equalization signal;

a data enable/reset unit coupled to the data latch unit that receives the latched comparison output signal; and a power down unit that turns off current supply to the sense amplifier according to an output signal of the data enable/reset unit.

26. A power down circuit for use with a sense amplifier for a semiconductor memory device, comprising:

a data comparator that compares data outputs from a sense amplifier;

a data latch unit that latches a comparison signal output from the data comparator;

a data enable/reset unit coupled to the data latch unit that receives the latched comparison output signal, wherein the data enable/reset unit comprises, a first logic gate that logically processes the latched comparison signal of the data latch unit and an equalization signal, a transmission gate that transmits an output signal from the first logic gate, and a transistor having a source receiving a supply voltage, a gate receiving the equalization signal and a drain coupled to an output of the transmission gate and to a power down unit; and wherein the power down unit turns off current supply to the sense amplifier according to an output signal from the data enable/reset unit.

* * * * *